United States Patent [19]

Millerick et al.

[11] Patent Number: 5,041,903
[45] Date of Patent: Aug. 20, 1991

[54] VERTICAL SEMICONDUCTOR INTERCONNECTION METHOD AND STRUCTURE

[75] Inventors: Michael A. Millerick, Dublin, Ireland; Gregory W. Pautsch, Chippewa Falls, Wis.

[73] Assignee: National Semiconductor Corp., Santa Clara, Calif.

[21] Appl. No.: 535,837

[22] Filed: Jun. 11, 1990

[51] Int. Cl.$^5$ ............................................. H01L 39/02
[52] U.S. Cl. ......................................... 357/80; 357/72; 357/74; 365/52; 365/72; 361/397; 361/398
[58] Field of Search ............... 357/80, 72, 74; 365/52, 365/72; 361/397, 398

[56] References Cited

U.S. PATENT DOCUMENTS

| | | | |
|---|---|---|---|
| 4,121,044 | 10/1978 | Hadersbeck et al. | 361/398 |
| 4,266,282 | 5/1981 | Henle et al. | 365/52 |
| 4,413,308 | 11/1983 | Brown | 357/80 |
| 4,426,689 | 1/1984 | Henle et al. | 365/52 |
| 4,825,284 | 4/1989 | Soga et al. | 357/80 |
| 4,855,809 | 8/1989 | Malhi et al. | 357/80 |
| 4,879,629 | 11/1989 | Tustaniwskyj et al. | 365/52 |
| 4,912,527 | 3/1990 | Bilowith et al. | 357/80 |
| 4,975,763 | 12/1990 | Baudouin et al. | 361/397 |

FOREIGN PATENT DOCUMENTS 59-113652 6/1984 Japan ..................................... 357/80

Primary Examiner—Andrew J. James
Assistant Examiner—Hung X. Dang
Attorney, Agent, or Firm—Steven F. Caserza; Lee Patch; Michael Glenn

[57] ABSTRACT

An integrated circuit package includes a plurality of TAB assemblies, each including a portion for inner lead bonding an integrated circuit. A portion of the tape is formed to allow the tape to be outer lead bonded to the substrate so that the integrated circuit is mounted at any desired non zero angle with respect to a horizontal substrate. A plurality of formed tape units are outer lead bonded to a horizontal substrate. In one embodiment, the die is inner lead bonded to the tape in an area which is not devoid of tape, allowing electrical traces on the tape which are routed above and not in contact with the surface of the die, thereby providing excellent routing density. The dielectric tape may include a single electrical interconnect layer, or a plurality of electrical interconnect layers which may themselves be electrically interconnected via suitable vias formed within the tape structure. In one embodiment, the portion of the tape opposite the area to which the integrated circuit die is to be inner lead bonded includes secondary metallization regions. Suitable vias in the tape connect these secondary metallization regions to selected ones of the metallic leads which are to be inner lead bonded to the integrated circuit. In one embodiment of this invention, the secondary metallization areas are fabricated sufficiently large to allow the mounting of additional components, for example chip capacitors used to filter the supply voltages applied to the integrated circuit.

18 Claims, 2 Drawing Sheets

VERTICAL SEMICONDUCTOR INTERCONNECTION METHOD AND STRUCTURE

BACKGROUND

This invention pertains to integrated circuits and more specifically to the packaging of integrated circuits such that they may be electrically connected to other circuitry.

The fabrication of integrated circuits is a complex art. However, the art of packaging relatively fragile integrated circuit chips in order to protect them, provide electrical interconnection to other devices, and remove what often amounts to a significant quantity of heat, is also a very complex art. A continuing state of technological advancement in the packaging of integrated circuits has been necessary in order to keep up with the advances made in integrated circuit complexity, density, and speed. In addition, it is highly desirable to provide such state of the art integrated circuit packaging in a reliable low cost manner, while minimizing the yield loss encountered in the packaging process.

In addition to the need for packaging modern, high density integrated circuits having, in some cases, a large number of electrical pins, it has also become essential to be able to assemble a plurality of integrated circuit devices in a single electronic system or subsystem. Such systems or subsystems also require a low cost, reliable, high yield method for assembling a plurality of integrated circuit devices in a small area and in a manner such that a substantial amount of heat may be removed.

It is known, for example, to mount a plurality of integrated circuit dice on a substrate, such as a ceramic substrate or a printed circuit board, and provide wire interconnections from the dice to the substrate. The integrated circuit dice are then encapsulated, utilizing a suitable compound such as one of a variety of epoxies. It is also known in the prior art to provide electrical connection to an integrated circuit die utilizing tape automated bonding (TAB). The tape includes a predefined pattern of electrical traces including portions extending out into a window generally centrally located, which exposed leads are used for inner lead bonding (ILB) to raised metallic bumps formed on the bonding pads of the integrated circuit die or on the tape. The traces on the tape extend to an outer edge where they are exposed for the purposes of outer lead bonding (OLB) to a lead frame, which is then encapsulated with a suitable epoxy in order to form a dual in line package (DIP) including package leads for electrical connection to other circuitry. For higher density application, packages have been developed which include more than one row of leads associated with each edge of the package. Surface mount devices (SMD) have been developed which either include small leads, or which are leadless, and which are designed for mounting on the surface of a printed circuit board without requiring a through hole formed in the printed circuit board. In yet another approach, the TAB outer lead bonding is made directly to a printed circuit board.

A good description of a wide variety of packaging techniques is provided in "Microelectronics Packaging Handbook," edited by R. Tummala & E. Rymaszewski, Van Nostrand Reinhold (1989), New York.

Another technique for packaging integrated circuits is described in U.S. Pat. No. 4,426,689 issued Jan. 17, 1984, to Henle et. al. Henle et. al. describe the assembly of integrated circuit dice by vertically mounting them on a horizontal substrate. Henle et. al. describe a first embodiment where all bonding pads on an integrated circuit die are located along one edge such that appropriate bonding techniques can be used to electrically and physically connect the integrated circuit bonding pads to corresponding electrical connection regions on the surface of the substrate. This allows a plurality of integrated circuit dice to be vertically mounted on a horizontal substrate in close proximity, thereby providing high packaging density.

Henle et. al. also describes the use of TAB for assembling the plurality of dice to the substrate. Henle et. al. describes TAB mounting a plurality of dice, which may have their bonding pads located along more than one edge. In this embodiment of Henle et. al., each die is mounted by inner lead bonding bumps formed on the bonding pads of the die to metallic fingers which extend into a window region of the tape, such that the dice are suspended within their associated windows. Henle et. al. then bend the tape in order to form a convoluted tape structure having dice suspended in the windows in a vertical fashion with respect to the horizontal substrate. Portions of the convoluted tape structure which do not contain the integrated circuit dice are formed substantially parallel to the surface of the substrate to allow outer lead bonding of the convoluted tape structure to appropriate metallic interconnects located on the surface of the substrate. Henle et. al. describe that the portions of the metallic traces on the tape which are to be used for outer lead bonding are formed in an open window, i.e. they extend into the window devoid of tape.

Henle et. al. describe the formation of a right angle connector for use in the first embodiment of their invention which does not utilize TAB. Henle et. al. describe that a metallic connector is bonded to the bonding pads and then clamped in a suitable tool. The integrated circuit die is then rotated with respect to the clamping device thereby causing the leads to be bent. This technique is also apparently used by Henle et. al. for causing the tape used in the second embodiment of Henle et. al. to be formed in a convoluted structure, i.e. clamping the portions of the tape which are to be outer lead bonded to the substrate, and which holds an integrated circuit die rotated with respect to the clamped portion of the tape.

Thus, Henle et. al. describe a TAB packaging technique in which a plurality of integrated circuit dice are inner lead bonded on a single piece of tape, which is then convoluted and outer lead bonded to a substrate, thereby connecting a plurality of integrated circuit dice to the substrate as one unit.

It is therefore one objective of this invention to provide a semiconductor package with increased interconnect density.

It is another objective of the present invention to provide a semiconductor package with increased yield, by allowing testing of individual components prior to assembly, and a reworking of the device by the replacement of individual assemblies, if needed.

SUMMARY OF THE INVENTION

In accordance with the teachings of this invention, a novel integrated circuit package structure and method are taught. A plurality of TAB assemblies are formed, each such assembly including a portion of tape to which is inner lead bonded an integrated circuit. The tape unit is then formed such that a portion of the tape is at a desired non zero angle to the surface of the integrated circuit. The tape is outer lead bonded to the substrate in such a manner that the integrated circuit is mounted at any desired non zero angle with respect to a horizontal substrate, for example, substantially vertical to the horizontal substrate. A non-perpendicular arrangement will reduce the overall height of the assembly. A plurality of such formed tape units are outer lead bonded to a horizontal substrate providing a high density electronic subsystem.

If desired, the bonding pads may be fabricated on any one or more edges of the integrated circuit die. In one embodiment, the bonding pads are formed along two opposite edges of the integrated circuit die. In another embodiment, the bonding pads are formed anywhere on the surface of the integrated circuit die, including regions interior to its periphery. In one embodiment, the die is inner lead bonded to the tape in an area which is not devoid of tape. In this embodiment, electrical traces on the tape are capable of being routed above and not in contact with the surface of the die, by providing excellent routing density. The dielectric tape may include a single electrical interconnect layer, or a plurality of electrical interconnect layers which may themselves be electrically interconnected via suitable vias formed within the tape structure.

In one embodiment of this invention, the portion of the tape opposite the area to which the integrated circuit die is to be inner lead bonded includes secondary metallization regions. Suitable vias in the tape connect these secondary metallization regions to selected ones of the metallic leads which are to be inner lead bonded to the integrated circuit. In one embodiment of this invention, the secondary metallization areas are fabricated sufficiently large to allow the mounting of additional components, for example chip capacitors used to filter the supply voltages applied to the integrated circuit.

DETAILED DESCRIPTION

Figure 1:
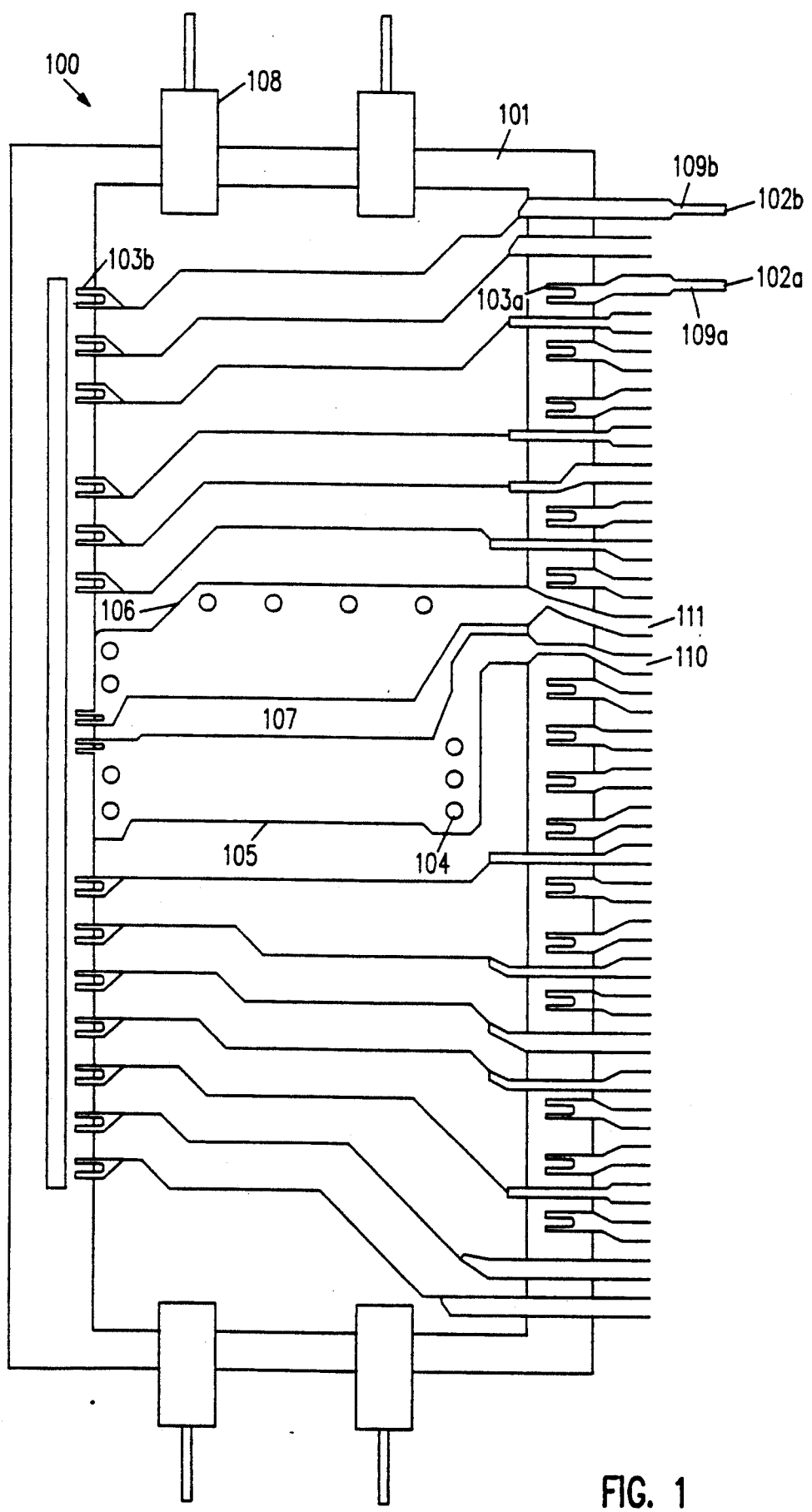
FIG. 1 is a composite view depicting one embodiment of the tape carrier constructed in accordance with the teachings of this invention.

FIG. 1 is a composite view depicting one embodiment of a tape carrier constructed in accordance with the teachings of this invention. Tape carrier 100 may be thought of as a solid sheet of film, except in those areas where film is absent, as will be now described. Tape carrier 100 includes a plurality of metal traces such as metal traces 102a and 102b. Metal trace 102a, for example, extends from its inner lead bonding region 103a, to a distant location (not shown) which is readily accessible for use during testing of the integrated circuit die when mounted on tape carrier 100. In one embodiment, ILB portion 103a of metallic interconnect lead 102a is formed within window 101 which is devoid of tape on at least one surface of ILB portion 103a. The ILB portion of the metallic interconnect leads are formed such that the metallic leads are exposed for inner lead bonding. In the embodiment shown in FIG. 1, metallic structural support means 108 are used in order to provide mechanical support between that portion of the tape located within window 101, and an outer frame (not shown, but described later with reference to FIG. 2).

In one embodiment, bonding pads are provided along only one side of the integrated circuit die which is to be mounted to tape assembly 100. In such an embodiment, ILB portions of metallic leads need only be provided on the edge of the die to which ILB portions 103a will be bonded. However, the embodiment of FIG. 1 is an example of a tape structure 100 for use in inner lead bonding to an integrated circuit die which includes bonding pads on two opposite edges. In accordance with this embodiment, tape is included within window 101, thereby allowing metallic traces to be formed on that portion of the tape which overlays the integrated circuit which will be inner lead bonded to tape structure 100.

Figure 2:
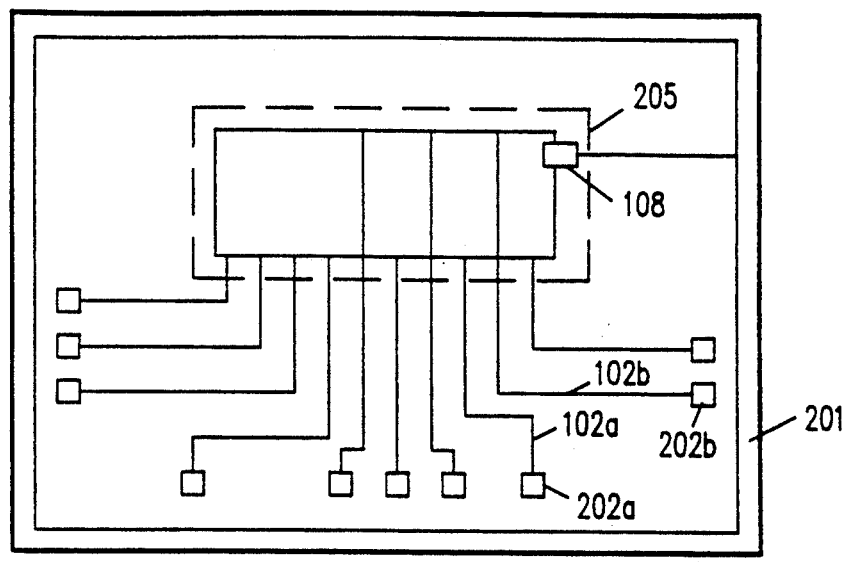
FIG. 2 is a plan view depicting a tape carrier formed within a suitable frame.

Also shown in FIG. 1 are those portions of metallic leads 109a and 109b which are the general vicinity at which the outer lead bonding will be performed to connect tape structure 100 to a substrate (not shown). The metallic leads for inner lead bonding are fabricated free of dielectric film. As shown in FIG. 1, metallic leads such as 102a and 102b extend beyond the outer lead bond areas 109a and 109b. Tape carrier 100 is formed generally within a suitable frame 201, as shown in FIG. 2. This allows metallic lead such as 102a and 102b to extend toward frame 201 for connection to suitable areas which are easily connected by test equipment, thereby providing access to test an inner lead bonded integrated circuit.

Once tested, that portion of the tape assembly which lies generally within dashed boxed 205 is removed from frame 201 for forming and outer lead bonding to a substrate.

Also, referring again to FIG. 1, one embodiment of tape assembly 100 includes secondary metallization regions 105 and 106 on its surface opposite where the integrated circuit is to be mounted. In one embodiment, metallization regions 105 and 106 are used to connect power signals to an external component which is mounted on metallization regions 105 and 106. Such an external component may comprise, for example, a chip capacitor of small physical size which is used for the well known purpose of decoupling the power supply signal provided to the integrated circuit. As shown in FIG. 1, metallic portions 105 and 106 are separated by region 107 across which will extend the external component. Metallization regions 105 and 106 are conveniently connected by the use of vias 104 to metallization on the opposite side of the tape, which metallization is used for either or both inner lead and outer lead bonding.

Figure 3:
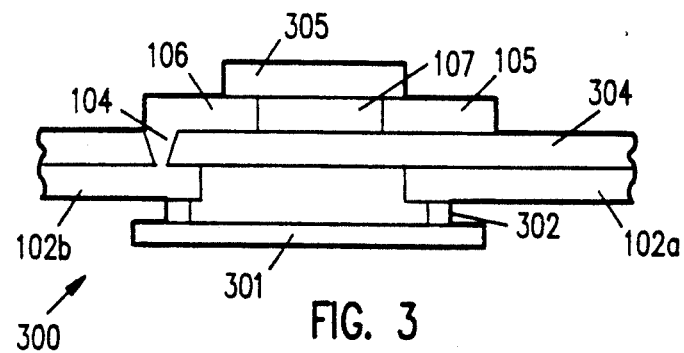
FIG. 3 is a cross-sectional view depicting the structure of FIG. 1 to which has been attached an integrated circuit die and the chip capacitor.

FIG. 3 depicts the cross-sectional view of the structure of FIG. 1 to which has been inner lead bonded integrated circuit die 301 and t which has been attached chip capacitor 305. As shown in FIG. 3, integrated circuit 301 includes bumps 302 formed on its bonding pad, for example in a well known manner. Integrated circuit die 301 is inner lead bonded via bumps 302 to metallic leads 102a and 102b formed on tape carrier 304. On the opposite side of tape 304 are located the metallic areas 105 and 106, to which is connected an external component, such as chip capacitor 305. Electrically separating metallic regions 105 to 106 is dielectric region 107 which comprises either tape or simply a gap. For purposes of illustration, metallization portion 106 is connected to lead 102b by way of via 104 which is formed through tape 304.

Figure 4A:
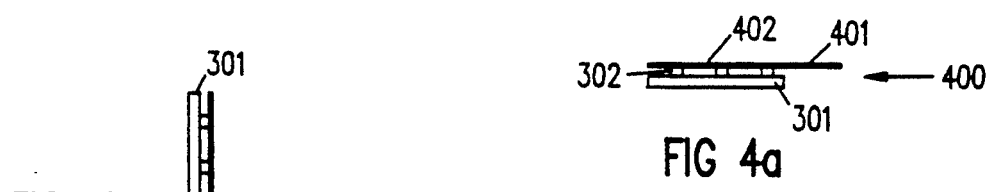
FIG. 4a is a cross-sectional view depicting one embodiment of a tape carrier of FIG. 1, including an integrated circuit die.
Figure 4B:
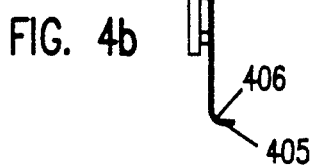
FIG. 4b is a cross-sectional view depicting the structure of FIG. 4a after it has been formed.

FIG. 4a depicts generally the structure of FIG. 3, although for the sake of simplicity chip capacitor 305 of FIG. 3 is not shown in FIG. 4a. However, it is readily understood that chip capacitor 305 would, if used, be electrically and mechanically attached generally to area 402 on the side of tape 401 opposite where integrated circuit die 301 is inner lead bonded. An individual integrated circuit tape unit 400 as shown in FIG. 4a is then formed to have a foot 405 as shown in FIG. 4b. Foot 405 is formed by bending a portion of the tape to a desired angle with respect to that portion of the tape to which integrated circuit die 301 is inner lead bonded. This is accomplished in any convenient manner such that foot 405 is attached to the remainder of the tape via radius 406 which might either be a smooth curve or which may be formed of several sharper bends so as to provide the desired angle between foot 405 and the remainder of the tape. While FIG. 4b is a cross-sectional view, it will be readily appreciated that foot 405 includes a plurality of metallization leads which will be outer lead bonded to the substrate. If desired, the structure is formed in accordance with the teachings of co-pending U.S. Pat. Application Ser. No. 07/535,838, filed June 11, 1990 on an invention of Ooi et al.

Figure 5:
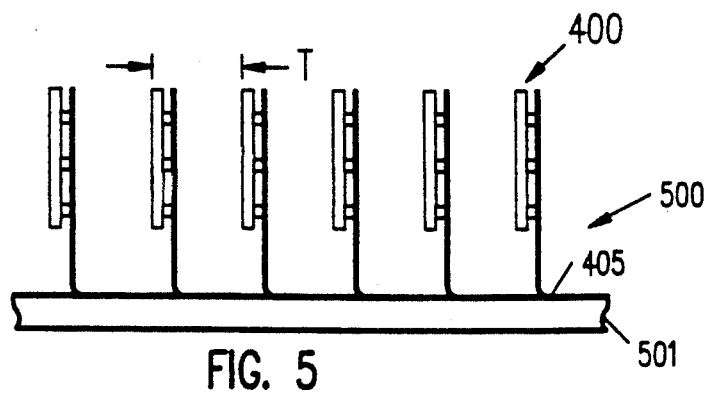
FIG. 5 is a cross-sectional view depicting a portion of the substrate including a plurality of tape mounted integrated circuits in accordance with the teaching of this invention.

FIG. 5 is a cross-sectional view depicting a plurality of tape mounted integrated circuits, where the tape units 400 are outer lead bonded to substrate 501. Substrate 501 may comprise, for example a printed circuit board or a ceramic substrate, or any other convenient substrate. Substrate 501 includes a plurality of metal traces (not shown) on its surface to which are outer lead bonded the corresponding metallic traces contained on foot 405 of each of the integrated circuit tape assemblies 400. As shown in FIG. 5, extremely high packing density is provided since the pitch T between adjacent integrated circuit tape assemblies can be made extremely small. In fact, pitch T is dictated by the thickness of the integrated circuit tape assembly 400 (including the integrated circuits mounted thereon) plus the length of its foot 405. Foot 405 need only be sufficiently large to provide for adequate outer lead bonding using, for example, conventional solder reflow or thermo compression outer lead bonding techniques utilizing a suitably small outer lead bonding tool. As an example, but not to be construed as a limitation on the scope of this invention, pitch T is typically on the order of approximately 50 to 150 mils.

As shown in FIG. 5, individual integrated circuit assemblies 400 are capable of being outer lead bonded to a common substrate 501, thereby providing a very high density of electronic components. Furthermore, since a plurality of individual integrated circuit tape assemblies 400 are mounted to substrate 501, increased yield is possible as compared with the prior art. This is true because individual integrated circuit tape assemblies 400 are assembled and tested prior to being outer lead bonded to substrate 501. Furthermore, in the event a problem develops during or after the assembly of an individual integrated circuit tape assembly 400 by its outer lead bonding to substrate 501, that individual integrated circuit tape assembly 400 can be removed and a replacement substituted.

The integrated circuits contained within integrated circuit tape assemblies 400 may be encapsulated in any convenient manner. In one embodiment of this invention, the integrated circuits are not encapsulated in the traditional sense, for example by using epoxy, but rather the entire subassembly 500 including substrate 501 and integrated circuit tape assemblies 400 is immersed in a substantially inert environment. For example, subassembly 500 is immersed in a bath of inert liquid, such as a fluorocarbon liquid of the type available from, for example, 3M Corporation. This allows the integrated circuits, as well as their inner lead bonds and outer lead bonds, to be maintained in a noncorrosive environment. This also provides a large cooling capacity whereby the individual integrated circuits are maintained at a relatively low temperature, thereby enhancing the operation of the integrated circuits.

All publications and patent applications are herein incorporated by reference to the same extent as if each individual publication or patent application was specifically and individually indicated t be incorporated by reference.

The invention now being fully described, it will be apparent to one of ordinary skill in the art that many changes and modifications can be made thereto without departing from the spirit or scope of the appended claims.

What is claimed is:

1. A semiconductor device package comprising:
   a substrate including a first surface; and
   a plurality of individual integrated circuit tape assemblies electrically and physically coupled to said substrate, each of said individual integrated circuit tape assemblies comprising:
   a first tape portion having a first surface for inner lead bonding to an integrated circuit, said first tape portion being disposed such that said first surface is at a selected angle with respect to said substrate so as to be nonparallel with said first surface of said substrate;
   a second tape portion having a first surface for outer lead bonding to said first surface of said substrate; and
   a formed portion connecting said first and second tape portions, said formed portion serving to cause said first tape portion to be disposed at said selected angle from said second tape portion;
   wherein said individual integrated circuit tape assemblies are not physically attached directly to each other.

2. A structure as in claim 1 wherein one or both of said first and second tape portions comprise a plurality of layers of electrical interconnections.

3. A structure as in claim 1 wherein said first tape portion includes a third tape portion which extends generally above said integrated circuit, and having a first surface for said inner lead bonding to said integrated circuit.

4. A structure as in claim 3 wherein said third tape portion comprises:

a first region having on said first surface a first plurality of locations for inner lead bonding to associated bonding locations on said integrated circuit;

a second region having on said first surface a second plurality of locations for inner lead bonding to associated bonding locations on said integrated circuit; and one or more electrical interconnects extending on said tape portion generally from said first region to said second region to provide electrical connection to said second plurality of locations for inner lead bonding.

5. A structure as in claim 3 wherein said third tape portion comprises a plurality of layers of electrical interconnections.

6. A structure as in claim 3 which further comprises means for mounting an additional component to a second surface of said third tape portion opposite said first surface.

7. A structure as in claim 6 wherein said additional component comprises a capacitor.

8. A structure as in claim 7 wherein said capacitor is electrically connected to said power supply signals provided to said integrated circuit.

9. A structure as in claim 6 wherein said means for mounting an electrical component comprises a layer of electrically conductive material formed on said second surface of said third tape portion, patterned to provide a desired pattern for electrical and physical connection to said electrical component.

10. A structure as in claim 9 which further includes vias through said tape for electrically connecting desired portions of said electrically conductive material formed on said second surface of said third tape portion to desired portions of said electrically conductive material on said first surface of said tape.

11. An integrated circuit tape assembly comprising:
a first tape portion having a first surface for inner lead bonding to an integrated circuit;
a second tape portion having a first surface for outer lead bonding to a substrate;
a formed portion connecting said first and second tape portions, said formed portion serving to cause said first tape portion to be disposed nonparallel to said second tape portion; and
a third tape portion formed as an extension of said first tape portion and extending generally above said integrated circuit, and having a first surface for said inner lead bonding to said integrated circuit,
wherein said individual integrated circuit tape assemblies are not physically attached directly to each other.

12. A structure as in claim 11 wherein at least one of said first, second, and third tape portions comprises a plurality of layers of electrical interconnections.

13. A structure as in claim 11 wherein:
said first tape portion comprises a first edge having a first plurality of locations for inner lead bonding to associated bonding locations on said integrated circuit; and
said third tape portion comprises:
a second edge having a second plurality of locations for inner lead bonding to associated bonding locations on said integrated circuit; and
one or more electrical interconnects extending generally from said second tape portion to said second edge of said third tape portion to provide electrical connection to said second plurality of locations for inner lead bonding.

14. A structure as in claim 13 which further comprises means for mounting an additional component to a second surface of said third tape portion opposite said first surface.

15. A structure as in claim 14 wherein said additional component comprises a capacitor.

16. A structure as in claim 15 wherein said capacitor is electrically connected to said power supply signals provided to said integrated circuit.

17. A structure as in claim 14 wherein said means for mounting an electrical component comprises a layer of electrically conductive material formed on said second surface of said third tape portion, patterned to provide a desired pattern for electrical and physical connection to said electrical component.

18. A structure as in claim 17 which further includes vias through said tape for electrically connecting desired portions of said electrically conductive material formed on said second surface of said third tape portion to desired portions of said electrically conductive material on said first surface of said tape.

* * * * *